United States Patent
Petti et al.

(10) Patent No.: US 11,031,059 B2
(45) Date of Patent: Jun. 8, 2021

(54) MAGNETIC RANDOM-ACCESS MEMORY WITH SELECTOR VOLTAGE COMPENSATION

(71) Applicant: SanDisk Technologies LLC, Addison, TX (US)

(72) Inventors: Christopher J. Petti, Mountain View, CA (US); Tz-Yi Liu, Palo Alto, CA (US); Ali Al-Shamma, San Jose, CA (US); Yoocharn Jeon, Palo Alto, CA (US)

(73) Assignee: Sandisk Technologies LLC, Addison, TX (US)

( * ) Notice: Subject to any disclaimer, the term of this patent is extended or adjusted under 35 U.S.C. 154(b) by 0 days.

(21) Appl. No.: 16/281,699

(22) Filed: Feb. 21, 2019

(65) Prior Publication Data
US 2020/0273512 A1    Aug. 27, 2020

(51) Int. Cl.
*G11C 11/16* (2006.01)
*H01L 27/22* (2006.01)

(52) U.S. Cl.
CPC ...... *G11C 11/1673* (2013.01); *G11C 11/1659* (2013.01); *G11C 11/1675* (2013.01); *H01L 27/224* (2013.01)

(58) Field of Classification Search
CPC .. G11C 11/15; G11C 11/1673; G11C 11/1675
USPC ....................................................... 365/158
See application file for complete search history.

(56) References Cited

U.S. PATENT DOCUMENTS

| 10,453,532 B1* | 10/2019 | Antonyan | G11C 16/10 |
| 2006/0067103 A1* | 3/2006 | Ferrant | G11C 11/15 365/148 |
| 2011/0051495 A1* | 3/2011 | Ito | G11C 5/147 365/148 |
| 2011/0188305 A1* | 8/2011 | Yang | G11C 11/1653 365/171 |
| 2017/0271004 A1 | 9/2017 | Jeon | |
| 2019/0027201 A1 | 1/2019 | Petti et al. | |

FOREIGN PATENT DOCUMENTS

| JP | 2010086638 A | 4/2010 |
| JP | 2013532344 A | 8/2013 |
| JP | 2016511502 A | 4/2016 |

* cited by examiner

*Primary Examiner* — Anthan Tran
(74) *Attorney, Agent, or Firm* — Volpe Koenig (57) ABSTRACT

Magnetic random-access memory (MRAM) circuits are provided herein. In one example implementation, an MRAM circuit includes control circuitry coupled to a magnetic tunnel junction (MTJ) element in series with a selector element. This control circuitry is configured to adjust current through the selector element when the selector element is in a conductive state. The circuit also includes a compensation circuitry configured to compensate for a offset voltage across the selector element in the conductive state based on adjustments to the current through the selector element. An output circuit is also configured to report a magnetization state of the MTJ element.

9 Claims, 9 Drawing Sheets

MAGNETIC RANDOM-ACCESS MEMORY WITH SELECTOR VOLTAGE COMPENSATION

TECHNICAL FIELD

Aspects of the disclosure are related to the fields of magnetic random-access memory devices employing magnetic tunnel junction elements.

BACKGROUND

Magnetic random-access memory (MRAM) is an emerging memory/storage technology that has potential to offer a lower power and non-volatile alternative to random-access memory (RAM) technologies like static RAM (SRAM) and dynamic RAM (DRAM). MRAM can also be employed in bulk storage environments, such as in solid-state storage drives (SSDs). However, MRAM has proven difficult to incorporate into DRAM-competitive devices. DRAM devices typically have densities and per-bit costs which outpace most other competing memory technologies.

Various approaches can be employed to for MRAM-based memories. One such approach includes a cross-point configuration, which can also be applied in resistive RAM technologies. In cross-point configurations, memory cells are arranged into large arrays coupled via rows and columns, with a memory cell at each junction of a row and column. However, cross-point configurations can be difficult to form into high density configurations using these emerging memory technologies, like MRAM. Difficulty can arise when memory cells are individually arranged with selection circuitry that isolates each cell during programming operations. Some MRAM implementations have three-terminal transistors coupled to each memory cell, which adds significantly to the associated part count while reducing target densities of MRAM devices.

OVERVIEW

Magnetic random-access memory (MRAM) circuits are provided herein. In one example implementation, an MRAM circuit includes control circuitry coupled to a magnetic tunnel junction (MTJ) element in series with a selector element. This control circuitry is configured to adjust current through the selector element when the selector element is in a conductive state. The circuit also includes compensation circuitry configured to compensate for a offset voltage across the selector element in the conductive state based on adjustments to the current through the selector element. An output circuit is also configured to report a magnetization state of the MTJ element.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Several memory storage technologies have emerged which can replace conventional transistor-based memory and storage. These include resistive random-access memory (RRAM), phase-change memory (PCM), and magnetic random-access memory (MRAM), as well as others. Among these, MRAM has potential to offer a lower power alternative to embedded SRAM, and to provide a cost-effective, non-volatile replacement for stand-alone DRAM. To compete with or replace DRAM, MRAM must be formed into dense enough arrays. This can be challenging because of the low cost and high density of DRAM, and MRAM must be made to exhibit the low error levels of DRAM. Cross-point arrays are one approach to implement dense arrays of MRAM. MRAM cells typically have two storage states representing binary bits, with each state having essentially linear current-voltage relationships. Thus, a discrete or separate selection device is typically used to electrically isolate MRAM cells from each other in arrays. These selection devices might comprise a three-terminal transistor selector, such as a negative/positive metal-oxide semiconductor transistor. However, including a transistor selector for each memory cell can add greatly to the cell size and reduce densities for MRAM arrays due to the large size of the selectors as well as the need for routing of gate control lines to each memory cell. Also, since the cell resistance of the two aforementioned MRAM states are typically only 2-3 times apart in resistance values, any selector employed should have a non-linear behavior. This non-linear behavior would correspond to a high resistance at low voltages, and a low resistance at high voltages. Also, a desirable selector might also have a threshold switching behavior, where once a threshold switching condition is met, such as a threshold voltage, then the selector remains in the selected state with some degree of hysteresis.

MRAM cells, as discussed herein, comprise a non-volatile memory (NVM) element which can be formed with one or more magnetic elements which store data as one or more magnetic states. MTJ devices typically employ spin polarized currents to reversibly switch a magnetization state of a ferromagnetic layer. MTJs operate using tunnel magnetoresistance (TMR), which is a magneto-resistive effect. MTJs typically consist of two layers of ferromagnetic materials separated by a thin insulator layer through which electrons can quantum-mechanically tunnel from one ferromagnetic layer into the other. One ferromagnetic layer of an MTJ can be referred to as a pinned layer which has a fixed magnetization state, while another ferromagnetic layer of an MTJ comprises a free layer which can change in magnetization state. An intermediate layer comprising a thin insulator separating the two ferromagnetic layers can be formed from an oxide material or other suitable electrical insulator. Electrical terminals can be formed to interface the free and pinned layers of the MTJ to other components in a circuit.

Perpendicular or parallel arrangements of MTJ elements can be employed in MRAM cells, which refer to a type of magnetic anisotropy associated with a preferred direction of alignment in magnetic moments within the MTJ element with respect to a surface of a corresponding semiconductor substrate. A first type of MTJ configuration includes a homogeneous perpendicular spin-transfer torque (STT) arrangement, which typically comprises a 2-terminal device formed from at least three stacked layers of material. These three layers include a tunnel barrier layer disposed between a pinned layer and a free layer. The free layer and the pinned layer are coupled to the two terminals of the STT MTJ. Other types of MTJs include spin orbit torque (SOT) MTJ elements, which can be employed in three-terminal Spin Hall Effect (SHE) MRAM cells.

MTJ elements, such as the STT MTJ elements mentioned above, can typically be placed into two different states, which can correspond to different logical values or data values stored therein. These states depend upon a magnetization state of the MTJ element, which corresponds to a magneto-resistive value presently exhibited by the MTJ element. The alterable magnetization states of MTJ elements discussed herein can change among two states, namely a parallel state and an anti-parallel state. A parallel state occurs when a free layer and pinned layer of an MTJ element are in the same magnetization state. An anti-parallel state occurs when a free layer and pinned layer of an MTJ element are in a different magnetization state. Data values can be assigned to the magnetization states, such as logical '0' for the anti-parallel state and logical '1' for the parallel state, among other configurations.

Figure 1:
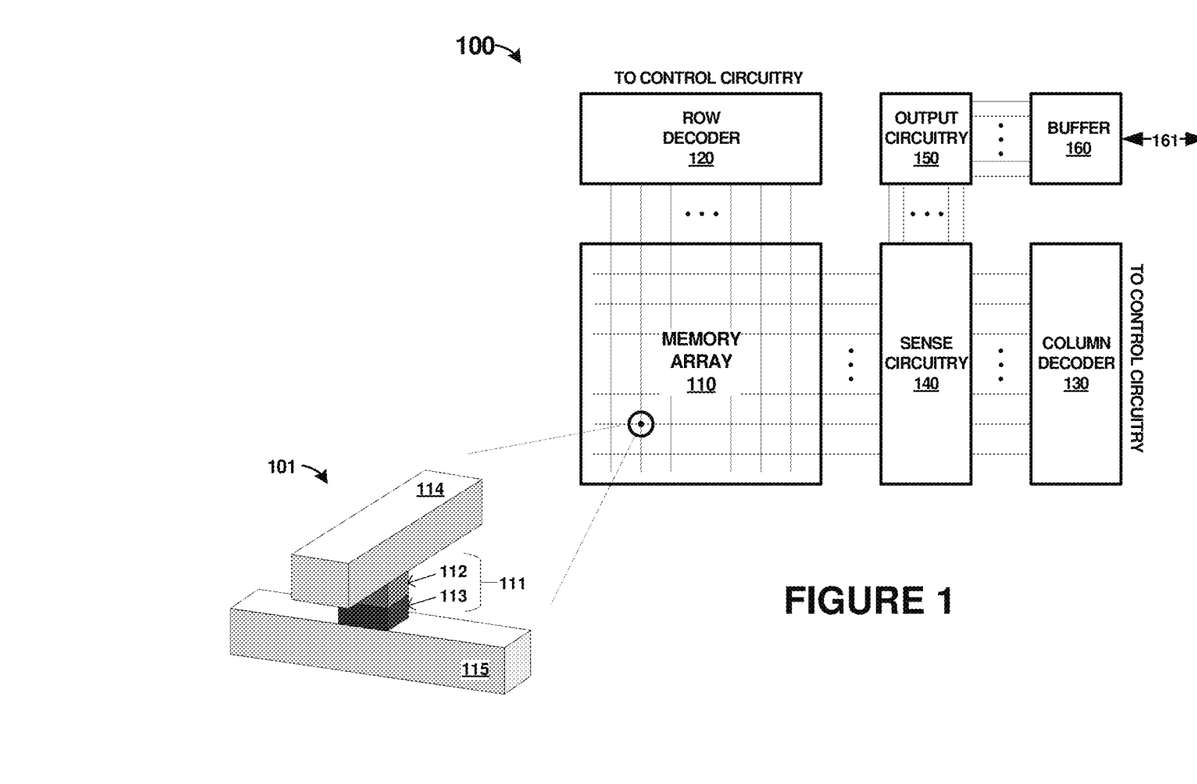
FIG. 1 illustrates a memory array and associated circuitry in an implementation.

Turning now to enhanced structures for implementing MRAM devices that employ MTJ elements, FIG. 1 is presented. FIG. 1 is a system diagram illustrating memory system 100, which includes memory array 110 and various peripheral circuitry. This peripheral circuitry comprises various control, interface, and sensing circuitry. In FIG. 1, system 100 further includes row decoder circuitry 120, column decoder circuitry 130, sense circuitry 140, output circuitry 150, and buffer circuitry 160. Various communication links and signal lines are shown in FIG. 1, although the specific implementation of these lines can vary. Typically, row and column signal lines will be employed in memory array 110 to form a cross-point memory arrangement. This cross-point memory arrangement comprises a memory cell at each junction of a row and a column. Memory array 110 can thus include 'm' quantity of rows and 'n' quantity of columns, creating an 'm' by 'n' array of junctions each corresponding to an individual memory cell. Although MRAM type of memory cells are discussed in FIG. 1, other memory technologies can be employed in cross-point memory arrangements.

FIG. 1 also includes an example memory cell detailed view 101. Detailed view 101 shows a component-level view of a portion of memory array 110, although this view is simplified for clarity. Typically, associated components of detailed view 101 are formed onto a semiconductor substrate using techniques found in semiconductor wafer processing and microfabrication, such as photo-lithography, diffusing, deposition, epitaxial growth, etching, annealing, and ion implanting, among others. Detailed view 101 includes row line 114 and column line 115. Selectable MRAM cell 111 is positioned at a physical junction between row line 114 and column line 115. Selectable MRAM cell 111 comprises MTJ element 112 and selector element 113. Further details on these elements are discussed below. Detailed view 101 is provided as an example configuration of memory cells in a cross-point memory. Each junction of a row and a column in a cross-point memory, such as memory array 110, can include a similar MRAM cell arrangement as shown in detailed view 101. Moreover, various interconnect, metallization, insulators, terminals, and other elements can be included during implementation of memory array 110.

Row decoder 120 and column decoder 130 will typically be coupled to control circuitry which is configured to control read, write, and erase operations, among other operations. Row decoder 120 and column decoder 130 each comprise line selection circuitry and logic to enable/disable particular rows and columns of memory array 110 as directed by control circuitry. Line selection circuitry can comprise selection transistors, buffers, inverters, current and voltage limiter circuitry, transmission gates, and other similar circuitry. In this manner, memory cells in memory array 110 can be read, written, or erased.

During read operations, sense circuitry 140 senses outputs of selected memory cells. Sense circuitry 140 can include sense amplifiers, comparators, level shifters, as well as various other support circuitry. Sense circuitry 140 provides representations of the outputs of selected memory cells to output circuitry 150. Output circuitry 150 comprises output circuitry to interpret the representations into data values, which can include the various enhanced circuitry described below in FIGS. 2, 3, 4, and 6. These data values can include binary values having voltage levels corresponding to desired logical representations. As will be discussed below, output circuitry 150 can reduce or eliminate the effect that selector elements have on sensed voltages when reading data bits out of memory array 110. Buffer 160 can comprise digital memory elements included to store data bits determined by output circuitry 150 before transfer to one or more external systems over data link 161. In some examples, portions of column decoder 130, sense circuitry 140, output circuitry 150, and buffer 160 can be combined into circuity blocks or shared over similar circuitry components.

Figure 2:
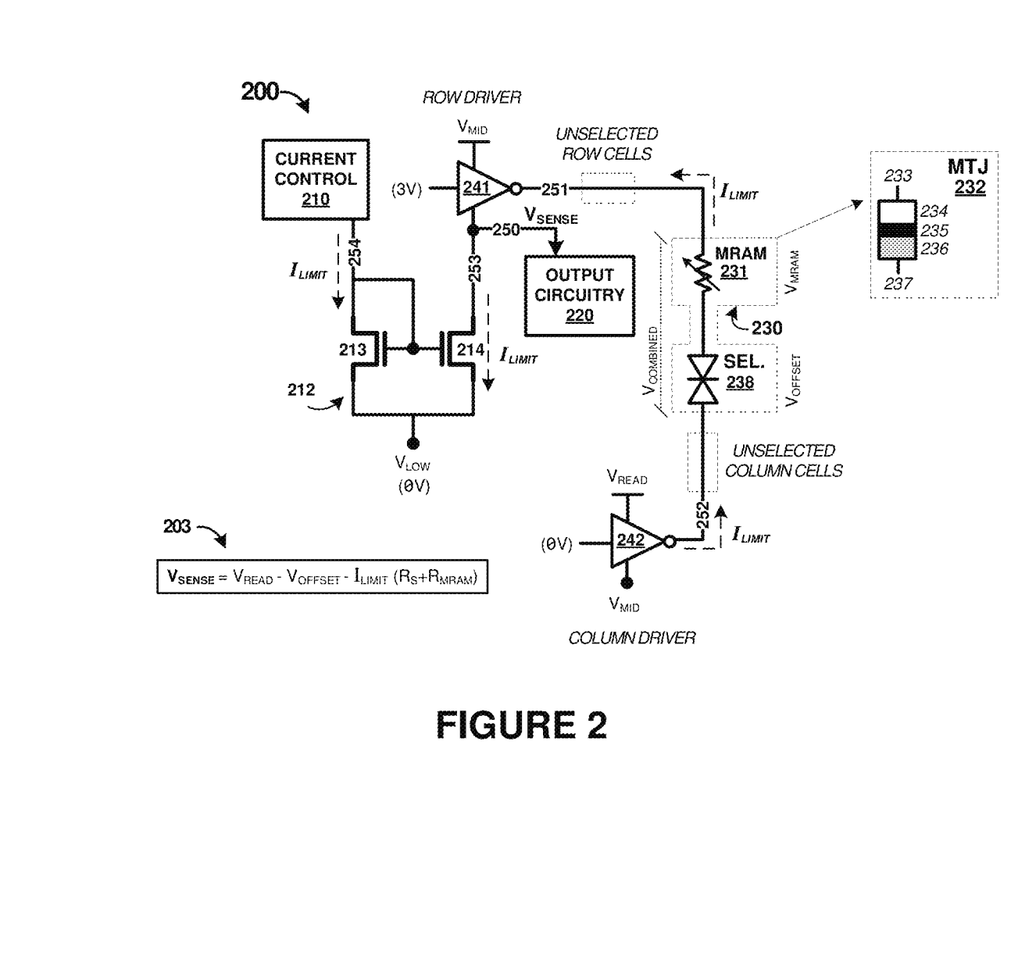
FIG. 2 illustrates a memory cell in an implementation.

Turning now to a detailed implementation of a selectable memory cell 111 from FIG. 1, as well as various support circuitry, FIG. 2 is provided. FIG. 2 represents a single 'junction' in a cross-point memory array, with associated row/column driver circuitry and memory cell. Specifically, FIG. 2 includes circuit 200 comprising current control circuitry 210, current mirror 212, output circuitry 220, selectable MRAM cell 230, row driver 240, and column driver 241. Selectable MRAM cell 230 might comprise an example implementation of selectable memory cell 111 from FIG. 1, with MTJ element 112 and selector element 113 of FIG. 1 represented by MRAM element 231 and selector 238, respectively. Selectable MRAM cell 230 can be referred to as a "1S-1MTJ" type of MRAM cell, formed by a single selector (S) and a single MTJ element. Selectable MRAM cell 230 might be formed at a row/column junction of a cross-point memory array, such as seen for row line 114 and column line 115 in FIG. 1. Thus, row line 251 can correspond to row line 114 in FIG. 1, and column line 252 can correspond to column line 115 in FIG. 1. Other memory cells at row/column junctions of FIG. 1 can have similar arrangements as seen in FIG. 2, although variations are possible.

MRAM element 231 comprises MTJ element 232, which is an STT type of MTJ element in this example. MTJ 232 is erased, written and read using corresponding electrical pulses. However, these electrical pulses are typically bipolar in nature, which refers to control voltages or control currents that might be applied in either a first polarity or second polarity across MRAM element 231 by column driver 242 and row driver 241. In order to prevent other MRAM elements of a selected row or column from being inadvertently erased, written and read when corresponding electrical pulses are generated, selector 238 is included in series with MRAM element 231.

Selector 238 is a two-terminal selector element comprising a bipolar selector in FIG. 2. Selector 238 might comprise a chalcogenide ovonic threshold switch or a volatile conductive bridge, although other technologies can be employed. Selector 238 forms a conductive (e.g. low relative resistance) bridge between the two terminals of selector 238 once a threshold condition has been exceeded, such as a threshold voltage ($V_t$) and selector 238 is placed into a conductive state. After activation of the selector 238 by exceeding the threshold condition, as long as sufficient current or voltage are present on selector 238, then selector 238 remains in the active state having a low resistance relative to the inactive state. Once sufficient current or voltage is not present, such as falling below a hysteresis threshold, then selector 238 changes to an inactive state (high relative resistance). The conductive path between the two terminals of selector 238 then collapses or deactivates. The hysteresis behavior can be controlled in selector 238. An amount of hysteresis exhibited by selector 238 is directly related to a voltage that is applied to MRAM element 231. Specifically, when turned 'on', selector 238 acts as a voltage source in series with MTJ 232 comprising MRAM element 231. The magnitude of this voltage source corresponds to a holding voltage, referred to herein as an offset voltage, also referred to herein as $V_{OFFSET}$. This offset voltage can interfere with accurate reading of a present magnetization state of MTJ 232.

Figure 9:
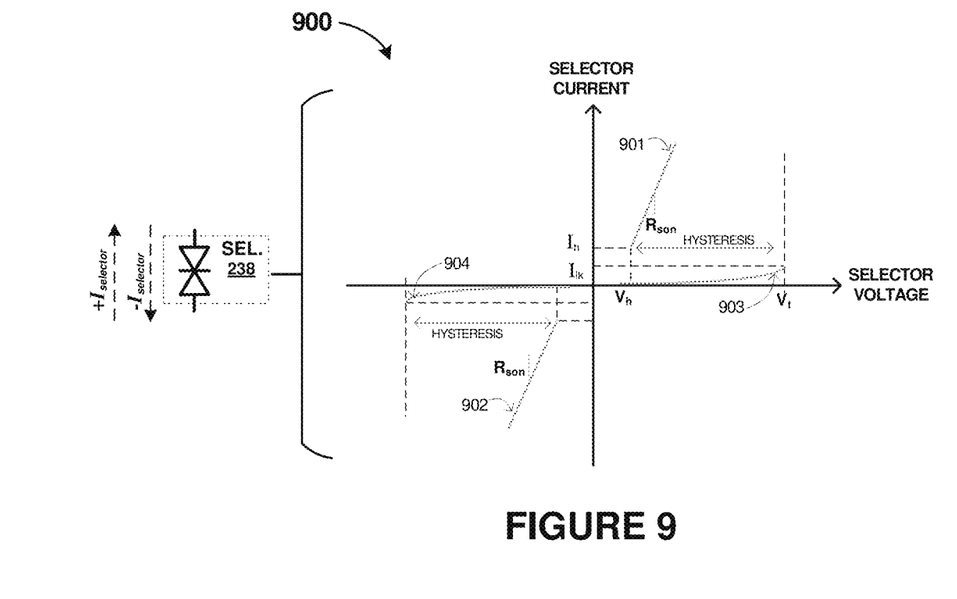
FIG. 9 illustrates example characteristics of a selector element in an implementation.

Example characteristics of selector 238 are shown in FIG. 9. FIG. 9 includes graph 900 illustrating behavior of selector 238 over various voltages and currents. A vertical axis of graph 900 corresponds to a selector current, or current that is presently passing through selector 238. A horizontal axis of graph 900 corresponds to a selector voltage, or a voltage that is presently across selector 238. The lower-left quadrant and upper-right quadrants of graph 900 show behavior of selector 238 in a bipolar manner. The lower-left quadrant illustrates a negative polarity having a negative selector current ($-I_{selector}$), while the upper-left quadrant illustrates a positive polarity having a positive selector current ($+I_{selector}$). The associated polarities can be reversed in other examples, and the bipolar nature of selector 238 is typically symmetric with regard to polarity.

Graph 900 illustrates the current-voltage (IV) curve of selector 238 in both the negative and positive polarities. This IV curve is represented by the plot portions 901-904 in FIG. 9. Selector 238 exhibits a non-linear response in graph 900. An 'off' state of selector 238 corresponds to a high device resistance and a low leakage current ($I_{lk}$) at low applied voltages. This 'off' state is represented by plot portions 903-904 in graph 900. An 'on' state of selector 238 corresponds to a low device resistance at high applied voltages ($>V_t$), and is represented by plot portions 901-902 in graph 900. $R_{son}$ corresponds to a slope of the corresponding plot portions, which comprises an 'on' resistance for selector 238 for each polarity. Selector 238 exhibits a threshold switching behavior, where once a threshold voltage ($V_t$) is exceeded ($>V_t$), then selector 238 changes from the high resistance 'off' state (plot portions 903-904) to a low resistance 'on' state (plot portions 901-902).

Hysteresis behavior of selector 238 is also shown in graph 900. The hysteresis behavior in graph 900 corresponds to the points on the voltage axis obtained by extrapolating the selector 'on' state current-voltage (IV) curve. Specifically, this hysteresis corresponds to where the applied voltage can fall to $V_h$, which is below $V_t$, and after $V_t$ has been exceeded. Also, this hysteresis behavior has a corresponding current limit ($I_h$) below which the selector can switch states to an 'off' state. Actual performance of selector 238, as well as 'on' and 'off' resistance values, will vary based on manufacturing variation, device sizing, and other implementation-specific details. Thus, the offset voltage exhibited by selector 238 when in the 'on' state can also vary. The examples herein provide for enhanced compensation techniques for reducing the effect of the offset voltage of selector 238, as well as compensation for variation in the offset voltage among different selectors in an array.

Returning to FIG. 2, an example circuit 200 is shown. In operation, a current ($I_{LIMIT}$) is limited through portions of circuit 200 by current mirror 212 positioned on the 'low' potential side of circuit 200. The low potential side of circuit 200, referred to in FIG. 2 as $V_{LOW}$, corresponds to an end of the circuit that is coupled to a low potential or low voltage, namely 0V in typical cases. The current drawn by current mirror 212 varies based on a current limit set by current control circuitry 210, and control of this limit is discussed in further detail below. Current control circuitry 210 is thus configured to limit a current through selectable MRAM cell 230. In one embodiment, the control circuitry 210 limits a read current employed during a read operation for selectable MRAM cell 230. In operation, current mirror 212 mirrors whatever current limit is set by current control circuitry 210 from the left-hand side of current mirror 212 to the right-hand side of current mirror 212, due the particular coupling of gates of transistors 213 and 214. This current is drawn through selectable MRAM cell 230 and other series-connected circuitry and interconnect, such as unselected row lines and unselected column lines. Row driver 241 and column driver 242 are coupled to associated row line 251 and column line 252 which form a series circuit with selectable MRAM cell 230.

During application of the current (Limn), a sense voltage is presented (referred to herein as $V_{SENSE}$) at current mirror 212, which is used to sense a state of MTJ 232. This sensing voltage can be expressed as: $V_{SENSE}=V_{READ}-V_{OFFSET}-I_{LIMIT}(R_S+R_{MRAM})$, which is indicated as equation 203 in FIG. 2. $V_{READ}$ is applied as a supply voltage to column driver 242, $V_{OFFSET}$ is the voltage across selector 238, $R_S$ is the series resistance of lines and components in series with MTJ 232, and $R_{MRAM}$ is a presently exhibited resistance of MRAM element 231. The presently exhibited resistance of MRAM element 231 ($R_{MRAM}$) is reflective of a magnetization state of MTJ 232, and thus represents the data or bit value stored within MRAM element 231.

The voltage ($V_{COMBINED}$) across selectable MRAM cell 230 corresponds to $I_{LIMIT}*R_{MRAM}$. $I_{LIMIT}$ is typically set so that $V_{COMBINED}$ is between about 0.1-0.3 V, to protect against read disturb (unintentional writing/programming during read operations). Thus, the variation in $V_{OFFSET}$ should be less than about 10-30 mV. In practice, it is difficult to manufacture a selector to within such a specific $V_{OFFSET}$ range. For example, if a selector has an offset voltage of 1.3 V, controlling the $V_{OFFSET}$ to 10-30 mV would imply controlling the $V_{OFFSET}$ to within <2.5%. Advantageously, the examples herein compensate for variations in the offset voltage of a selector, such as selector 238 shown in FIG. 2. These examples include compensation circuitry 320 in FIG. 3, compensation circuitry 420 in FIG. 4, and compensation 620 in FIG. 6, among other examples. The examples presented herein substantially negate the variation of the selector VOFFSET. This enlarged margin can be used for other sources of variation, for example, MRAM diameter variations. The examples presented herein will be useful in producing stand-alone MRAM products in the 16-64 Gb range, for DRAM replacement.

Three example implementations for sensing the magnetization state of MTJ 232 of selectable MRAM cell 230 are shown below. In each example implementation, output circuitry 220 has a corresponding configuration for sensing a voltage or voltages at $V_{SENSE}$, while current control circuitry 210 controls current mirror 212 for corresponding $I_{LIMIT}$ magnitudes. Specifically, the examples below apply a plurality of current limits ($I_{LIMIT}$) and sense how $V_{SENSE}$ changes as $I_{LIMIT}$ changes. Since $V_{OFFSET}$ is constant with $I_{LIMIT}$, $V_{OFFSET}$ can be compensated for in a final result. In many cases, this compensation refers to a subtraction in the effect of $V_{OFFSET}$ on $V_{SENSE}$. This corresponds to the mathematical derivative of $V_{SENSE}$ with respect to $I_{LIMIT}$ in the equation noted above, namely a derivative of equation 203.

Figure 3:
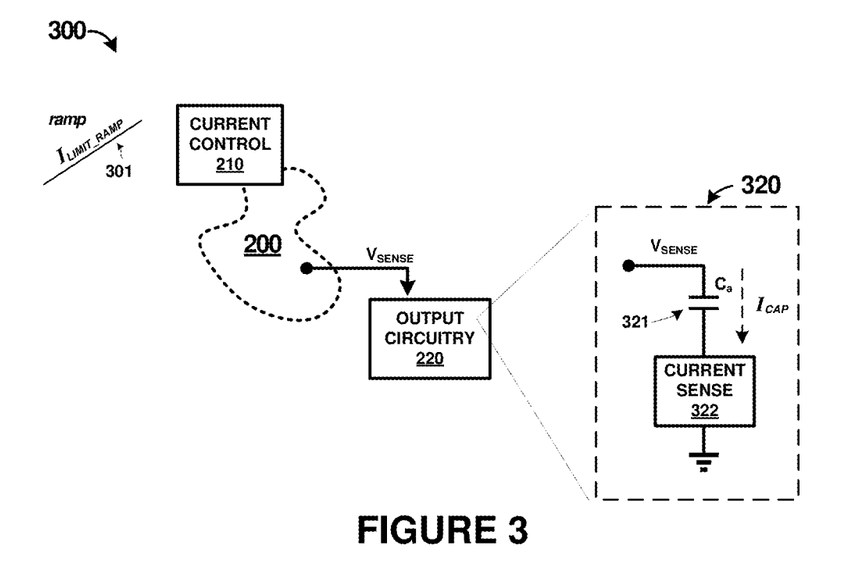
FIG. 3 illustrates example control and output circuitry for a memory cell in an implementation.

FIG. 3 is presented to illustrate a first example implementation 300. In FIG. 3, output circuitry 220 comprises compensation circuitry 320. Compensation Circuitry 320 includes capacitor 321 and current sense circuitry 322, which is coupled to a low potential (e.g. ground). In this example, capacitor 321 having a capacitance value of $C_a$ is coupled to the $V_{SENSE}$ electrical node of FIG. 2. Moreover, current control circuitry 210 is configured to apply a ramped current 301 to circuit 200. This ramped current 301 ramps $I_{LIMIT}$ at a constant rate of $dI_{LIMIT}/dt$, indicated by $I_{LIMIT\_RAMP}$ in FIG. 3. A capacitor current ($I_{CAP}$) that passes from $V_{SENSE}$ through capacitor 331 to ground corresponds to a derivative of $V_{SENSE}$. Specifically, $I_{CAP}=dV_{SENSE}/dt=C_a*dI_{LIMIT}/dt*(R_S+R_{MRAM})$. Once $I_{CAP}$ has been determined, then a magnetization state of MRAM cell 231 can be determined based on a value determined for $R_{MRAM}$. Advantageously, sensing $I_{CAP}$ rather than $V_{SENSE}$ reduces or eliminates the effect of $V_{OFFSET}$ (and associated selector device-to-device variations) in equation 203.

In FIG. 2, current sense circuitry 322 can be employed to sense $I_{CAP}$. In one example, current sense circuitry 322 can comprise a current mirror, similar to that shown for current mirror 212. A reference current for the current mirror can be used to sense the state of $I_{CAP}$. In another example, current sense circuitry 322 can comprise a resistor of a particular resistance, such as 50-100 kiloohms, coupled to a terminal of capacitor 321. current sense circuitry 322 can then sense a voltage drop over that resistor with a comparator or other similar circuitry. This voltage drop can be used to determine the $I_{CAP}$.

Figure 4:
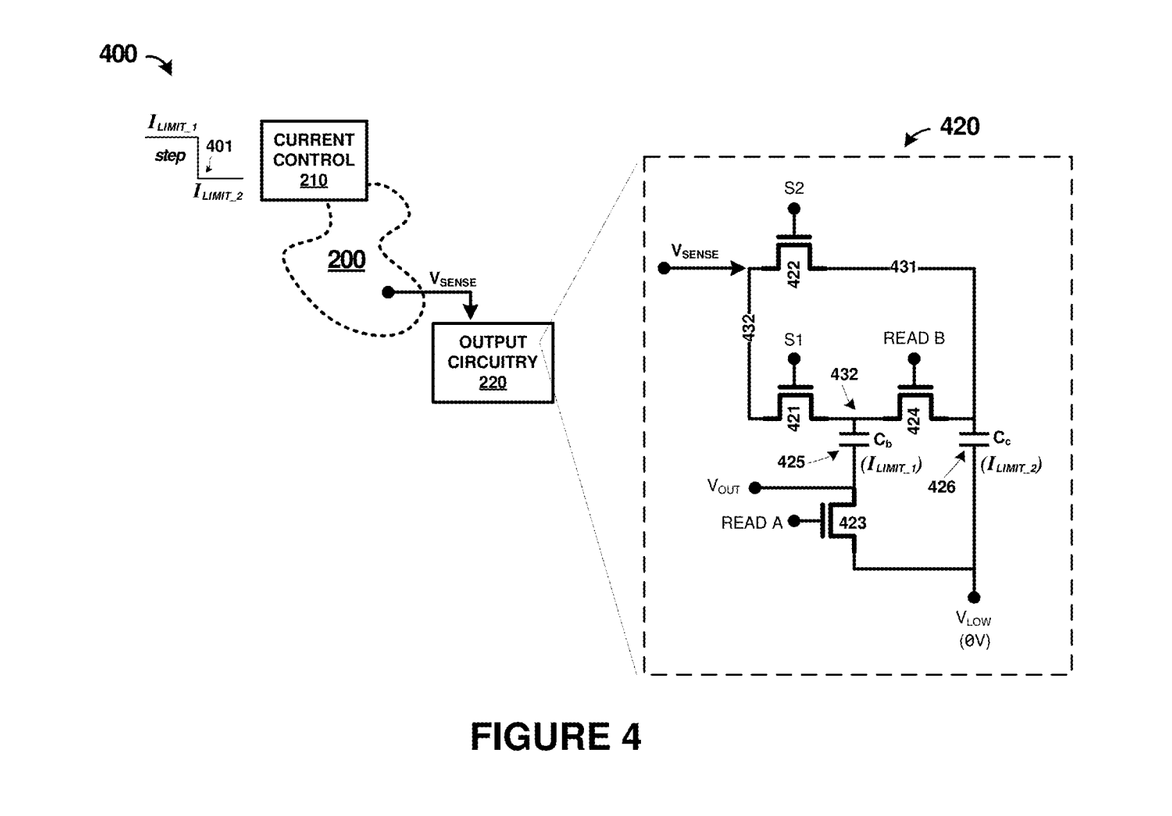
FIG. 4 illustrates example control and output circuitry for a memory cell in an implementation.

However, the implementation shown in FIG. 3 has challenges, due in part to the relative complexity in sensing $I_{CAP}$. Another example implementation 400 of output circuitry 220 is presented in FIG. 4. In FIG. 4, samples of $V_{SENSE}$ are determined for two different values for $I_{LIMIT}$. The two samples of $V_{SENSE}$ are then subtracted to obtain a result. This result corresponds to a type of discrete differentiation of equation 203, and is then used to determine a magnetization state of MRAM cell 231. As with the circuitry and techniques in FIG. 3, the result determined by the circuitry in FIG. 4 also reduces or eliminates the effect of $V_{OFFSET}$ (and associated selector device-to-device variations) in equation 203.

In FIG. 4, output circuitry 220 comprises compensation circuitry 420. Compensation circuitry 420 includes several transistor-based switching elements which selectively provide a voltage present on $V_{SENSE}$ to capacitors 425 and 426.

In FIG. 4, direct measurement of a current through a capacitance element is not performed, as done in FIG. 3. Instead, two different values for $V_{SENSE}$ are subtracted using capacitors 425 and 426 to produce $V_{OUT}$ which reduces or eliminates the effect of $V_{OFFSET}$.

A first switching element (transistor 421) has a gate terminal coupled to a first selection signal (S1), and a second switching element (transistor 422) has a gate terminal coupled to a second selection signal (S2). Drain terminals of transistors 421-422 are coupled to $V_{SENSE}$. Capacitors 425 and 426 each have a corresponding capacitance value, namely $C_b$ and $C_c$ in FIG. 4. Particular capacitance values will vary based on implementation, but in this example $C_b$ and $C_c$ comprise the same value as each other. Read transistors 423 and 424 comprise a readout circuit which performs a subtraction operation among voltages stored by $C_b$ and $C_c$, as well as to present a resultant voltage on $V_{OUT}$. Specifically, a gate terminal of transistor 423 is coupled to a first read control signal (READ A), and a gate terminal of transistor 424 is coupled to a second read control signal (READ B). A source terminal of transistor 421 is coupled to a first terminal of capacitor 425 and a drain terminal of transistor 424. A source terminal of transistor 424 is coupled to capacitor 426 and the source terminal of transistor 422. A source terminal of transistor 423 and a second terminal of capacitor 426 are coupled to a low potential, such as ground or 0V. $V_{OUT}$, which presents a result from compensation circuitry 420, is coupled to a drain terminal of transistor 423.

In operation, current control circuitry 210 is configured to apply a stepped current 401 to circuit 200. This stepped current corresponds to a first constant value of $I_{LIMIT}$, namely $I_{LIMIT\_1}$, followed by a second constant value of $I_{LIMIT}$, namely $I_{LIMIT\_2}$. In this example, $I_{LIMIT\_1}$ is greater than $I_{LIMIT\_2}$, although other configurations are possible. Example current limits are 11 microamps (µA) for $I_{LIMIT\_1}$ and 2 µA for $I_{LIMIT\_2}$. These current limits are selected by current control circuitry 210 to produce mirrored currents by current mirror 212 which draws the currents through at least MRAM element 231 and selector 238 in circuit 200, as well as associated row and column lines.

Figure 5:
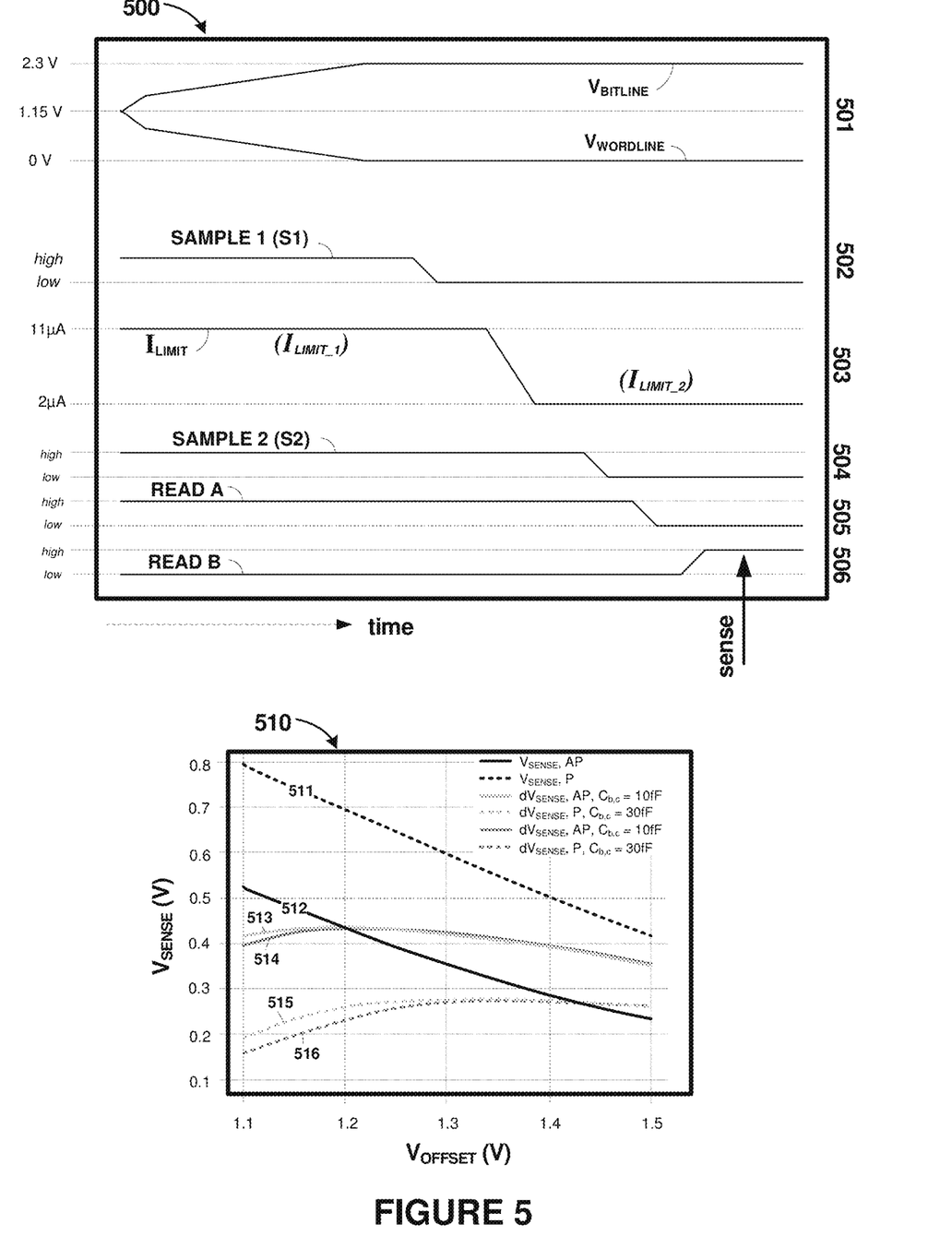
FIG. 5 illustrates example signaling and performance of a memory cell in an implementation.

FIG. 5 illustrates timing diagram 500 that details control signaling for compensation circuitry 420. In diagram 500, selector 238 is changed to an 'on' state by exceeding a threshold condition, such as a threshold voltage or threshold current. A voltage can be established across selectable MRAM cell 230 which produces a voltage above the threshold voltage ($V_t$) for selector 238, as seen in plot 501 of diagram 500. Specifically, a voltage is established as the difference between $V_{BITLINE}$ and $V_{WORDLINE}$, or 2.3V in this example. $V_{BITLINE}$ corresponds to a voltage applied to column line 252 by column driver 242. $V_{WORDLINE}$ corresponds to a voltage applied to a row line 251 by row driver 241. Once selector 238 is placed into the 'on' state than a current can pass through selector 238. As long as that current remains above a hysteresis current value, then selector 238 will remain in the 'on' state or low resistance state. If the current falls below the hysteresis current value, then selector will change to the 'off' state and will cease to pass appreciable current due to the high resistance state.

A first current limit is applied to a current through selectable MRAM cell 230, namely $I_{LIMIT\_1}$ at 11 µA. This first current limit can be seen in plot 503 of diagram 500. The first selection signal (S1) and the second selection signal (S2) remain at a high voltage which controls the associated transistor (421, 422) to be in an active state, allowing the corresponding capacitors (425, 426) to track the voltages presented on $V_{SENSE}$ over various current limits. Specifically, while $I_{LIMIT\_1}$ is been applied, the first selection signal (S1) is driven to a high voltage (active state) as seen in plot 502, which controls transistor 421 to pass a voltage presented on $V_{SENSE}$ to node 432 and capacitor 425. Capacitor 425 stores this value of $V_{SENSE}$ at $I_{LIMIT\_1}$, and then S1 is disabled by driving the gate terminal to a low voltage (inactive state) to isolate capacitor 425 from $V_{SENSE}$. A second current limit is applied to a current through selectable MRAM cell 230, namely $I_{LIMIT\_2}$ at 2 μA. This second current limit can be seen in plot 503 of diagram 500. The transition from $I_{LIMIT\_1}$ to $I_{LIMIT\_2}$ can be a ramp of a speed selected to ensure a desired timing of operations of compensation circuitry 420 while keeping electromagnetic interference and ringing below target levels. While $I_{LIMIT\_2}$ is been applied, the second selection signal (S2) is driven to a high voltage (active state) as seen in plot 504, which controls transistor 422 to pass a voltage presented on $V_{SENSE}$ to node 431 and capacitor 426. Capacitor 426 stores this value of $V_{SENSE}$ at $I_{LIMIT\_2}$, and then S2 is disabled by driving the gate terminal to a low voltage (inactive state) to isolate capacitor 426 from $V_{SENSE}$.

Once both capacitors 425 and 426 have been charged using a particular sample of $V_{SENSE}$ for a particular current limit, then a subtraction can be performed among the voltages stored in capacitors 425 and 426. First, the READ A signal is brought to a low voltage to disable transistor 423 (plot 505), while the READ B signal is brought to a high value to enable transistor 424 (plot 506). This configuration of READ A and READ B signals allows the voltages stored in capacitors 425 and 426 to be subtracted from each other over transistor 424 and a resultant voltage presented at $V_{OUT}$. An output or result from compensation circuitry 420 can then be sensed at $V_{OUT}$, as shown according to approximate timing in diagram 500 (sense). This result at $V_{OUT}$ corresponds to a calculation of a discrete differentiation of equation 203, and is then used to determine a magnetization state of MRAM cell 231.

Diagram 510 in FIG. 5 shows simulated results using this process described above for compensation circuitry 420 and diagram 500. The particular selector used as selector 238 in the simulation of diagram 510 is a ovonic threshold switch (OTS) having a 1.7 V threshold voltage ($V_t$) at an ambient temperature of 85° C. Example capacitance values for $C_b$ and $C_c$ are also shown, with example values of 10 femtofarads (fF) and 30 fF for associated curves in diagram 510. Moreover, curves are shown for each binary value stored in the associated MRAM element, indicated by parallel (P) and antiparallel (AP) magnetization state of the corresponding MTJ element.

In diagram 510, curves 511 and 512 show the $V_{SENSE}$ sensing window without using the process described above for FIG. 4 and diagram 500, as a function of the $V_{OFFSET}$ of selector 238. As can be seen a large variation in $V_{SENSE}$ with $V_{OFFSET}$ is exhibited. Curves 513-516 show the voltage $V_{OUT}$ of compensation circuitry 420 using the capacitive subtraction method. The variation of this voltage, $V_{OUT}$, with $V_{OFFSET}$ is much less for curves 511-512, and a margin for $V_{OFFSET}$>+/−0.2 V can be obtained, compared with a margin of +/−<1.2V shown in curves 511 and 512 without the capacitive subtraction circuit. Even better results would be obtained using a selector for selector 238 with lower leakage than the particular selector used in this simulation.

Figure 6:
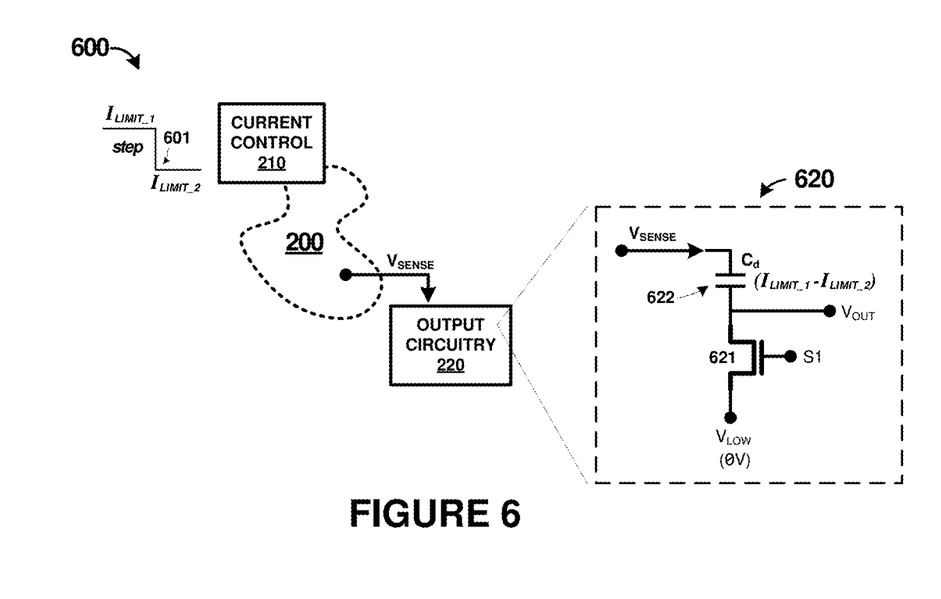
FIG. 6 illustrates example control and output circuitry for a memory cell in an implementation.

The circuitry, configurations, and operation found in FIG. 4 and FIG. 5 can be further simplified in another example implementation. FIG. 6 presents this example implementation 600. Implementation 600 comprises compensation circuitry 620 which employs a single capacitor 622 and a single switching element (transistor 621). In FIG. 6, samples of $V_{SENSE}$ are determined for two different values for $I_{LIMIT}$. The two samples of $V_{SENSE}$ are subtracted using capacitor 622 to obtain a result. This result corresponds to a type of discrete differentiation of equation 203, and is then used to determine a magnetization state of MRAM cell 231. As with the circuitry and techniques in FIGS. 3 and 4, the result determined by the circuitry in FIG. 6 also reduces or eliminates the effect of $V_{OFFSET}$ (and associated selector device-to-device variations) in equation 203. In FIG. 6, direct measurement of a current through a capacitance element is not performed, as done in FIG. 3. Instead, two different values for $V_{SENSE}$ are subtracted within capacitor 622 to produce $V_{OUT}$ which reduces or eliminates the effect of $V_{OFFSET}$.

In FIG. 6, output circuitry 220 comprises compensation circuitry 620. A voltage present on $V_{SENSE}$ is coupled to a first terminal of capacitor 622. Compensation circuitry 620 includes a single transistor-based switching element (621) which selectively couples or decouples a second terminal of capacitor 622 to a low potential, such as ground or 0V. Transistor 621 has a gate terminal coupled to a first selection signal (S1). A drain terminal of transistor 621 is coupled to the second terminal of capacitor 622 and $V_{OUT}$, and a source terminal of transistor 621 is coupled to the low potential. Capacitor 622 has a corresponding capacitance value, namely $C_d$ in FIG. 6. Particular capacitance values will vary based on implementation. $V_{OUT}$, which presents a result from compensation circuitry 620, is coupled to a drain terminal of transistor 621. A separate readout circuit, such as transistors 423 and 424, are not needed in compensation circuitry 620. Instead, transistor 621 and capacitor 622 comprise the readout circuit, as well as comprise the compensation circuitry.

In operation, current control circuitry 210 is configured to apply a stepped current 601 to circuit 200. This stepped current corresponds to a first constant value of $I_{LIMIT}$, namely $I_{LIMIT\_1}$, followed by a second constant value of $I_{LIMIT}$, namely $I_{LIMIT\_2}$. In this example, $I_{LIMIT\_1}$ is greater than $I_{LIMIT\_2}$, although other configurations are possible. Example current limits are 11 microamps (μA) for $I_{LIMIT\_1}$ and 2 μA for $I_{LIMIT\_2}$. These current limits are selected by current control circuitry 210 to produce mirrored currents by current mirror 212 which draws the currents through at least MRAM element 231 and selector 238 in circuit 200, as well as associated row and column lines.

Figure 7:
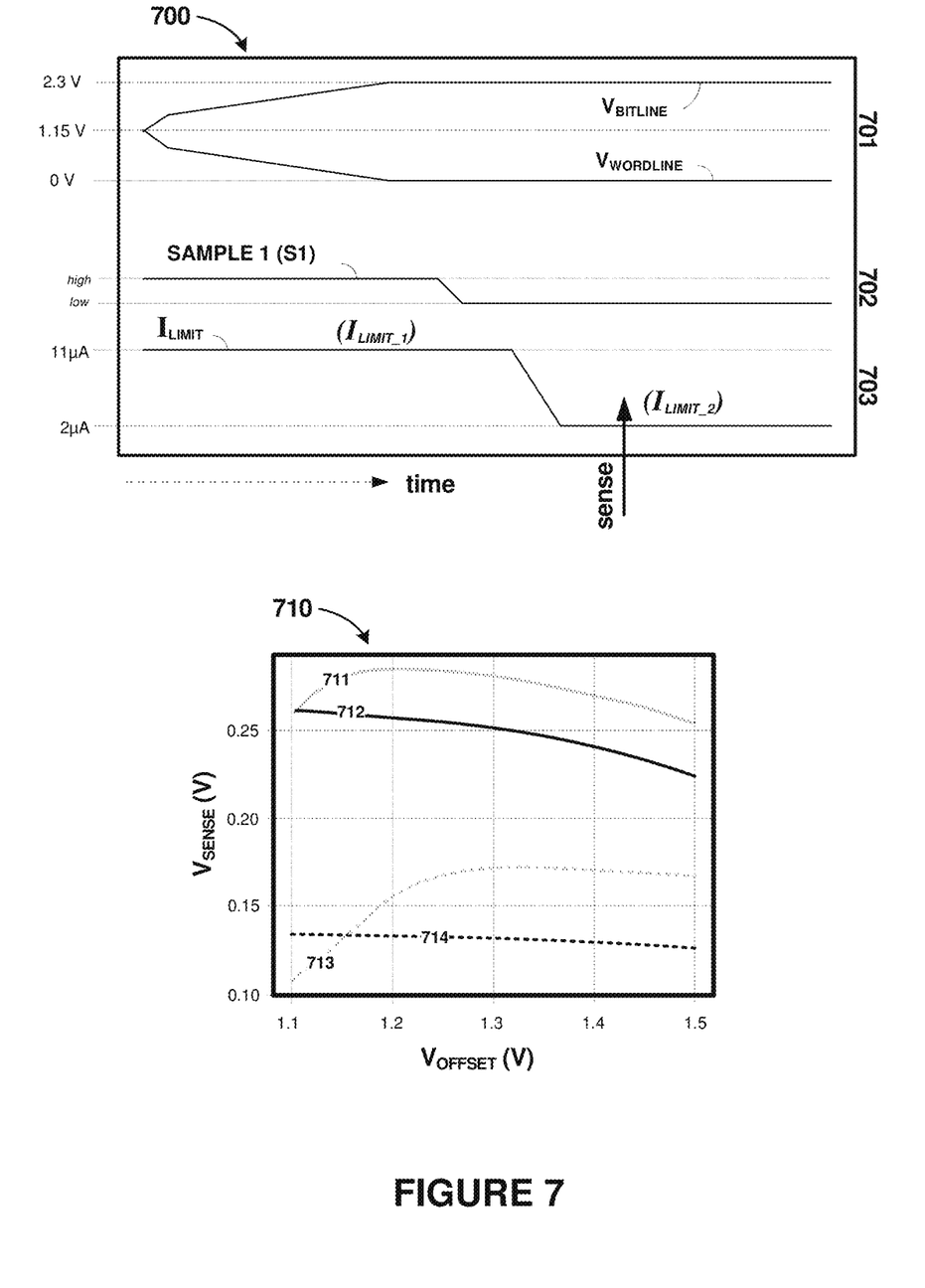
FIG. 7 illustrates example signaling and performance of a memory cell in an implementation.

FIG. 7 illustrates timing diagram 700 that details control signaling for compensation circuitry 620. In diagram 700, selector 238 is changed to an 'on' state by exceeding a threshold condition, such as a threshold voltage or threshold current. A voltage can be established across selectable MRAM cell 230 which produces a voltage above the threshold voltage ($V_t$) for selector 238, as seen in plot 701 of diagram 700. Specifically, a voltage is established as the difference between $V_{BITLINE}$ and $V_{WORDLINE}$, or 2.3V in this example. $V_{BITLINE}$ corresponds to a voltage applied to column line 252 by column driver 242. $V_{WORDLINE}$ corresponds to a voltage applied to a row line 251 by row driver 241. Once selector 238 is placed into the 'on' state than a current can pass through selector 238. As long as that current remains above a hysteresis current value, then selector 238 will remain in the 'on' state or low resistance state. If the current falls below the hysteresis current value, then selector will change to the 'off' state and will cease to pass appreciable current due to the high resistance state.

A first current limit is applied to a current through selectable MRAM cell 230, namely $I_{LIMIT\_1}$ at 11 μA. This first current limit can be seen in plot 703 of diagram 700. The first selection signal (S1) remains at a high voltage during the first current limit which controls the associated transistor 621 to be in an active state, allowing the corresponding capacitor 622 to track the voltages presented on $V_{SENSE}$ over the first current limit. Specifically, while $I_{LIMIT\_1}$ is been applied, the first selection signal (S1) is driven to a high voltage (active state) as seen in plot 702, which controls transistor 621 to couple to the low potential. Capacitor 622 can charge to the voltage present on $V_{SENSE}$ during $I_{LIMIT\_1}$. Before current control circuitry 210 applies the second current limit ($I_{LIMIT\_2}$), the first selection signal (S1) is driven low as seen in plot 703, placing transistor 621 into an inactive state and floating the second terminal of capacitor 622 with respect to the low potential. However, the first terminal of capacitor 622 is still coupled to $V_{SENSE}$. Once current control circuitry 210 applies the second current limit ($I_{LIMIT\_2}$), then the voltage present at $V_{SENSE}$ is continuously subtracted from the initially sampled value of $V_{SENSE}$ during the first current limit ($I_{LIMIT\_1}$). After transition of the current from $I_{LIMIT\_1}$ to $I_{LIMIT\_2}$, then a voltage at the second terminal of capacitor 622 at $V_{OUT}$ corresponds to a result of compensation circuitry 620. An output or result from compensation circuitry 620 can then be sensed at $V_{OUT}$, as shown according to approximate timing in diagram 700 (sense). This result at $V_{OUT}$ corresponds to a calculation of a discrete differentiation of equation 203, and is then used to determine a magnetization state of MRAM cell 231.

Diagram 710 in FIG. 7 shows simulated results using this process described above for compensation circuitry 620 and diagram 700. The particular selector used as selector 238 in the simulation of diagram 510 is a ovonic threshold switch (OTS) having a 1.7 V threshold voltage ($V_t$) at an ambient temperature of 85° C. Example capacitance values for $C_d$ in diagram 710 are set to 10 fF, although other values can be employed. Moreover, diagram 710 shows a comparison among compensation circuitry 420 employing two capacitors and compensation circuitry 620 employing one capacitor. The single capacitor-based circuit of compensation circuitry 620 gives a result even less dependent on $V_{OFFSET}$ than the two-capacitor circuit of compensation circuitry 420. Advantageously, compensation circuitry 620 has a less complex configuration, smaller part count, presents less total capacitance to $V_{SENSE}$ and $V_{OUT}$, and can produce a faster result than compensation circuitry 420.

In diagram 710, curves 711 and 713 show the $V_{SENSE}$ sensing window using compensation circuitry 420, as a function of the $V_{OFFSET}$ of selector 238. Curves 712 and 714 show the $V_{SENSE}$ sensing window using compensation circuitry 620, as a function of the $V_{OFFSET}$ of selector 238. As can be seen, a larger variation in $V_{SENSE}$ with $V_{OFFSET}$ is exhibited for curves 711 and 713 than for curves 712 and 714. The reduced variation of this voltage, $V_{OUT}$, with $V_{OFFSET}$ is much less for curves 712 and 714, and a margin for $V_{OFFSET}$>+/−0.1 V can be obtained using the single-capacitor circuit of compensation circuitry 620, compared with a margin of +/−<0.2V shown in curves 711 and 713 using the two-capacitor subtraction circuit of compensation circuitry 420. Even better results would be obtained using a selector for selector 238 with lower leakage than the particular selector used in this simulation.

Figure 8:
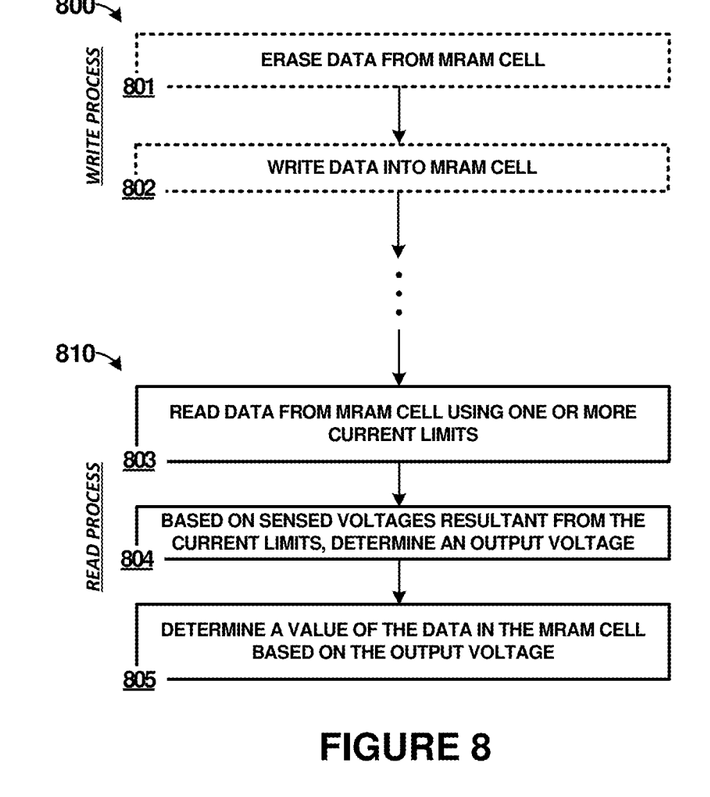
FIG. 8 illustrates example operations of a memory cell in an implementation.

FIG. 8 is now presented to illustrate operation of the various circuitry and systems discussed herein. The operations of FIG. 8 are discussed in the context of elements of FIG. 2, although different elements might instead be employed. In FIG. 8, a compensation is performed on voltages read from selectable MRAM cell 230. This compensation reduces an effect that selector 238 has on voltages that result from passing a current through selectable MRAM cell 230. Specifically, when enabled, selector 238 has a particular $V_{OFFSET}$ property which can vary from device-to-device as well as based on the current which passes through selector 238. Thus, it can be difficult to read a voltage of MRAM element 231 comprised of MTJ 232.

Although not required, some examples can perform an erase operation or a write operation before a read operation. Specifically, MRAM element 321 can be optionally erased into an initial state, and then a desired data value can be written or programmed into MRAM element 321. In another example, a read operation, such as discussed in operations 803-805, might be performed before an erase or write operation to determine a current state of MRAM element 321. If MRAM element 321 is in a desired state, then an erase or write operation can be omitted. In yet further examples, MRAM element 321 can be written or programmed without erasing into an initial state or without checking a previously programmed state via a read operation.

When an erase operation is desired, then optional operation 801 can be performed. In operation 801, data is first erased from selectable MRAM cell 230. This can be achieved by driving a voltage across selectable MRAM cell 230 which exceeds a threshold voltage ($V_t$) required to switch selector 238 into an active or conductive state. Once in the conductive state, then selector 238 can pass current which is used to erase the series connected MTJ 232 within selectable MRAM cell 230. This erase operation places the magnetization state of MTJ 232 into a desired initial state, which might represent a binary '1' or '0', among other values. This state corresponds to a parallel (P) or antiparallel (AP) state of MTJ 232, where a relatively large current can pass through MTJ 232 in a preferred direction or polarity to force MTJ 232 into the initial state (e.g. P or AP) depending upon the current polarity. Since selector 238 comprises a bidirectional or bipolar selector element, then selector 238 can pass current in either polarity for MTJ 232.

When employed into an array of MRAM cells, such as shown in FIG. 1, then particular column and row lines can be selected to reach a target MRAM cell for erasure. In cross-point memory arrays, such as that shown in FIG. 1, each memory cell is typically individually selectable at each junction of a column and row line. Various column and row selection circuitry can be employed to control the selection operation.

When a write operation is desired, then optional operation 802 can be performed. Selectable MRAM cell 230 can have a data value written or programmed into MRAM element 321. In optional operation 802, data is written into by driving a voltage across selectable MRAM cell 230 which exceeds a threshold voltage ($V_t$) required to switch selector 238 into an active or conductive state. Once in the conductive state, then selector 238 can pass current which is used to program the series connected MTJ 232 within selectable MRAM cell 230. This write operation places the magnetization state of MTJ 232 into a desired state to represent a data value, which might comprise a binary '1' or '0', among other values. These data values or data states correspond to a parallel (P) or antiparallel (AP) states of MTJ 232, where a current can pass through MTJ 232 in a preferred direction or polarity to force MTJ 232 into the desired state (e.g. P or AP) depending upon the current polarity. Since selector 238 comprises a bidirectional or bipolar selector element, then selector 238 can pass current in either polarity for MTJ 232.

Turning now to a discussion of enhanced read operations, selectable MRAM cell 230 can have a data value read from MRAM element 321. In operation 803, data is read from selectable MRAM cell 230 by driving a voltage across selectable MRAM cell 230 which exceeds a threshold voltage ($V_t$) required to switch selector 238 into an active or conductive state. Once in the conductive state, then selector 238 can pass current which is used to read a present magnetization state of the series connected MTJ 232 within selectable MRAM cell 230. This read operation produces a voltage across MTJ 232 which depends upon a previously programmed magnetization state that represents a data value, which might comprise a binary '1' or '0', among other values. These data values or data states correspond to a parallel (P) or antiparallel (AP) states of MTJ 232, where a current can pass through MTJ 232 in a preferred direction or polarity to produce a voltage across MTJ 232 which is reflective of the present magnetization state. Since selector 238 comprises a bidirectional or bipolar selector element, then selector 238 can pass current in either polarity for MTJ 232.

However, in the implementation of FIG. 2, read current is passed in the polarity indicated for $I_{LIMIT}$, namely from column driver 242 though column line 252, through series-connected selector 238 and MRAM element 231, through row line 251, and row driver 241. In operation, a voltage might be employed to change selector 238 into a conductive state, but then a current passed by selector 238 and MRAM element 231 is limited in magnitude using current control circuitry 210 in conjunction with current mirror 212. This current is limited in various ways to produce one or more voltages at $V_{SENSE}$. In a first example, shown in FIG. 3, a ramped current limit 301 is employed which produces a ramped voltage at $V_{SENSE}$. Compensation circuit 320 can be employed to receive $V_{SENSE}$ and compensate for the $V_{OFFSET}$ property of selector 238. This compensation advantageously reduces the effect of $V_{OFFSET}$ on a voltage produced across MTJ 232 by the applied read current, as well as reduces the influence of device-to-device variability in selector 238.

In a second example, shown in FIG. 4, a stepped current limit 401 is employed which produces two subsequent voltages at $V_{SENSE}$. Compensation circuit 420 can be employed to receive $V_{SENSE}$, temporarily store each value of $V_{SENSE}$. A first value of $V_{SENSE}$ stored from a first current limit is reduced by subtraction of a second value of $V_{SENSE}$ stored from a second current limit. Compensation circuit 420 can thus compensate for the $V_{OFFSET}$ property of selector 238 with this subtracted result. Similar to that of FIG. 3, the compensation performed in FIG. 4 advantageously reduces the effect of $V_{OFFSET}$ on a voltage produced across MTJ 232 by the applied read current, as well as reduces the influence of device-to-device variability in selector 238. However, compensation circuit 420 achieves this compensation with less circuit complexity than that of compensation circuit 320.

In a third example, shown in FIG. 6, a stepped current limit 601 is employed which produces two subsequent voltages at $V_{SENSE}$. Compensation circuit 620 can be employed to receive $V_{SENSE}$, temporarily store a first value of $V_{SENSE}$ during a first current limit, and subtract—within a single capacitor—a second value of $V_{SENSE}$ from the first (stored) value of $V_{SENSE}$ during a second current limit. Compensation circuit 620 can thus compensate for the $V_{OFFSET}$ property of selector 238 with this subtracted result. Similar to that of FIG. 4, the compensation performed in FIG. 6 advantageously reduces the effect of $V_{OFFSET}$ on a voltage produced across MTJ 232 by the applied read current, as well as reduces the influence of device-to-device variability in selector 238. However, compensation circuit 620 achieves this compensation with less circuit complexity than that of even compensation circuit 420.

As mentioned above, based on sensed voltages resultant from the various current limits, output circuitry 220 determines (804) an output voltage ($V_{OUT}$). Various compensation circuitry can be included to compensate for the effect of $V_{OFFSET}$ on a voltage produced across MTJ 232. However, the results of the compensation circuitry mentioned above typically comprises a derivative or differentiated version of $V_{SENSE}$ with the effect of $V_{OFFSET}$ subtracted out or otherwise eliminated. This can be represented by derivative or differentiated version of equation 203 of FIG. 2.

Output circuit 220 then determines (805) a value of the data in MRAM element 231 in selectable MRAM cell 230 based on the output voltage from the compensation circuitry. In some examples, output circuit 220 calculates an antiderivative, integration, or other mathematical manipulation on $V_{OUT}$ to determine the magnetization state of MTJ 232 in MRAM element 231. In further examples, output circuitry 220 can interpret $V_{OUT}$ directly to determine the magnetization state of MTJ 232 in MRAM element 231. For example, if the magnetization state of MTJ 232 in MRAM element 231 has two possible values (e.g. '1' and '0' corresponding to parallel and antiparallel states, in an example), then output circuitry 220 can determine a different in voltage among the two states once $V_{OFFSET}$ is reduced or removed from $V_{OUT}$. Thus, two different voltages of $V_{OUT}$ would each correspond to a particular magnetization state of MTJ 232 in MRAM element 231, and thus different data values. The data values can then be correlated to different logical levels, voltage levels, or other representations which are indicated to one or more external systems. In further examples, buffer 160 can be employed to store data values before transfer to one or more external systems.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the disclosure. Those skilled in the art will also appreciate that the features described above can be combined in various ways to form multiple embodiments. As a result, the disclosure is not limited to the specific embodiments described above, but only by the claims and their equivalents.

What is claimed is:

1. A circuit comprising:
control circuitry coupled to a magnetic tunnel junction (MTJ) element in series with a selector element, and configured to adjust current through the selector element when the selector element is in an active state;
compensation circuitry configured to subtract an effect of an offset voltage across the selector element in the active state by sensing a voltage based on a change in current through the selector element; and
output circuitry configured to report a magnetization state of the MTJ element.

2. The circuit of claim 1, comprising:
the control circuitry configured to initiate at least two current adjustments comprising different limits on current through the selector element; and
the compensation circuitry configured to compensate for the offset voltage across the selector element with an arithmetic operation computed on the at least two current adjustments to reduce an effect of the offset voltage.

3. The circuit of claim 2, the compensation circuitry comprising:
a capacitor coupled at a first terminal to a sense voltage that corresponds to a combined voltage drop across the selector element and the MTJ element;
a switching element configured to couple a second terminal of the capacitor to a reference potential during a first of the two current adjustments to charge the capacitor in accordance with the sense voltage;
the switching element configured to decouple the capacitor from the reference potential before a second of the two current adjustments; and
the compensation circuitry configured to subtract the sense voltage from the first of the two current adjustments and the sense voltage from the second of the two current adjustments to reduce the effect of the offset voltage across the selector element.

4. The circuit of claim 2, the compensation circuitry comprising:
a first switching element configured to charge a first capacitor with a sense voltage resultant from a first of the two current adjustments, wherein the sense voltage corresponds to a combined voltage drop across the selector element and the MTJ element;
a second switching element configured to charge a second capacitor with the sense voltage resultant from a second of the two current adjustments;
a readout circuit coupled to the first capacitor and the second capacitor, and configured to subtract a voltage present on the first capacitor from a voltage present on the second capacitor to reduce the effect of the offset voltage across the selector element.

5. The circuit of claim 1, wherein the current adjustments comprise a ramped current directed through the MTJ element and the selector element, and comprising:
the compensation circuitry configured to compensate for the offset voltage of the selector element by subtracting an effect of the offset voltage source of the selector element during the ramped current.

6. The circuit of claim 5, the compensation circuitry comprising:
a capacitor coupled to a sense voltage that corresponds to a combined voltage drop across the selector element and the MTJ element;
a readout circuit configured to determine the magnetization state of the MTJ element based on a current induced through the capacitor by the sense voltage during the ramped current.

7. The circuit of claim 6, the readout circuit comprising:
a current mirror coupled in series with the capacitor and configured to sense the current induced through the capacitor to determine the magnetization state of the MTJ element.

8. The circuit of claim 6, the readout circuit comprising:
a resistor coupled in series with the capacitor, the resistor configured to establish a voltage used to sense the current induced through the capacitor to determine the magnetization state of the MTJ element.

9. The circuit of claim 1, wherein the MTJ element comprises a spin-transfer torque (STT) MTJ element, and wherein the selector element is a two-terminal device comprising a chalcogenide ovonic threshold switch or a volatile conductive bridge.

* * * * *